United States Patent [19]

Ayata et al.

[11] Patent Number: 4,655,599
[45] Date of Patent: Apr. 7, 1987

[54] MASK ALIGNER HAVING A PHOTO-MASK SETTING DEVICE

[75] Inventors: Naoki Ayata, Machida; Yasuyoshi Yamada, Tokyo, both of Japan

[73] Assignee: Canon Kabushiki Kaisha, Tokyo, Japan

[21] Appl. No.: 550,097

[22] Filed: Nov. 9, 1983

[30] Foreign Application Priority Data

| Nov. 15, 1982 | [JP] | Japan | 57-200061 |
| Nov. 15, 1982 | [JP] | Japan | 57-200062 |
| Nov. 15, 1982 | [JP] | Japan | 57-200063 |
| Nov. 15, 1982 | [JP] | Japan | 57-200064 |
| Nov. 15, 1982 | [JP] | Japan | 57-200065 |
| Nov. 15, 1982 | [JP] | Japan | 57-200066 |

[51] Int. Cl.$^4$ ............................................. G01B 11/00
[52] U.S. Cl. ................................................ 356/401
[58] Field of Search ............... 356/400, 401; 355/53, 355/55; 250/548, 557, 571; 350/486

[56] References Cited

U.S. PATENT DOCUMENTS

| 4,052,603 | 10/1977 | Karlson | 355/86 |
| 4,153,371 | 5/1979 | Koizumi et al. | 356/400 |
| 4,167,677 | 9/1979 | Suzki | 250/548 |
| 4,262,208 | 4/1981 | Suzki et al. | 250/548 |
| 4,418,467 | 12/1983 | Iwai | 356/401 |
| 4,435,070 | 3/1984 | Kitajima | 355/55 |
| 4,469,442 | 9/1984 | Reich | 356/364 |

Primary Examiner—R. A. Rosenberger
Assistant Examiner—Crystal D. Cooper
Attorney, Agent, or Firm—Fitzpatrick, Cella, Harper & Scinto

[57] ABSTRACT

A mask aligner includes a photo-mask having a plurality of first marks used to align the photo-mask with a wafer and a plurality of second marks used to align the photo-mask with the mask aligner, the number of the second marks being equal to that of the first marks; a wafer having a plurality of third marks associated with the first marks; a mark providing section having a plurality of fourth marks associated with the second marks; and a detector for detecting an error in alignment between the first and third marks and also an error in alignment between the second and fourth marks, the detector including a plurality of sensors for sensing various marks in different positions, a basic form produced when the first and third marks are placed one above another being substantially the same as that produced when the second and fourth marks are placed one above another.

16 Claims, 10 Drawing Figures

MASK ALIGNER HAVING A PHOTO-MASK SETTING DEVICE

BACKGROUND OF THE INVENTION

1. Field of the Invention

The present invention relates to an apparatus for aligning two objects with each other and particularly, an apparatus for aligning a mask and wafer with each other prior to the exposure of the wafer to the pattern of semiconductor integrated circuit on a photo-mask or reticle, which will be referred to simply by the term "mask" hereinafter.

2. Description of the Prior Art

Semiconductor producing process includes sequential steps for projecting plural patterns to a wafer to form a semiconductor integrated circuit. In order to obtain the accurate positioning of a pattern on the wafer which has been exposed to a pattern or patterns in the previous step(s), a mask having that pattern thereon must be aligned with the wafer with high accuracy. Typically, such an alignment is automatically accomplished by photoelectrically detecting alignment marks on the mask and wafer with the resulting signals being used for the automatic alignment.

There is known a mask change mechanism comprising a mask carrier containing a mask therein and means for automatically setting the mask in the mask carrier precisely at a predetermined position. Such a mechanism must have a function that the mask is preliminarily aligned with an exposure stage just at a predetermined position for setting. This is called "mask alignment".

U.S. Pat. No. 4,052,603 states that the precise setting of a mask is particularly important for an aligner of such a type that it is operated in step-and-repeat motion. This patent provides an extremely cumbersome alignment method.

One of the prior art alignment systems provides a mask having an alignment mark for realizing the mask alignment and another alignment mark for detecting an error in relative position between the mask and a wafer to align them with each other. These alignment marks are different from each other in shape. It is believed that this is because the respective alignments should be made by different optical arrangements. This prior art alignment system further includes different sensors for detecting the respective alignment marks.

The prior art alignment system has various disadvantages. The different shapes in the alignment marks require a corresponding number of operational programs for detected signals. Different programs also are required to drive the different sensors. Additional sensors including the respective precise optical systems will make the aligner more expensive.

If any alignment mark is not in the field of view of the corresponding sensor upon alignment, a stage holding a wafer or mask or a detection optical system is moved to search that alignment mark. In the prior art, there is taken a searching method in which the stage or detection optical system are first moved to the margin of the searching range and then driven inwardly to search the alignment mark in the searching range.

In such a searching method, however, time is required to move the stage or detection optical system to the margin of the searching range. The stage is suitable for fine motion in its precisely positioning operation but not for rapid motion. This is further required because the search is initiated from the margin of the searching range in which the presence of the alignment mark is less possible. It is believed that the presence of the alignment mark is more convenient in the central setting position even if any mechanical error exists in setting.

SUMMARY OF THE INVENTION

It is a first object of the present invention to provide an aligner of such a simplified structure which can realize both the mask alignment and mask-wafer alignment.

A second object of the present invention is to provide an aligner comprising fewer sensors which can realize both the mask alignment and mask-wafer alignment.

A third object of the present invention is to provide an aligner comprising a common program for driving the sensors while realizing both the mask alignment and mask-wafer alignment.

A fourth object of the present invention is to provide an aligning apparatus for accurately effecting the mask alignment in a reduced period of time.

A fifth object of the present invention is to provide an alignment apparatus which can detect any alignment mark in a reduced period of time even if it is not in the field of view at the beginning of the search.

A sixth object of the present invention is to provide an aligner including a simplified mechanism for controlling the scan operation while executing a detection compatible to the required accuracy.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENTS

Figure 1:
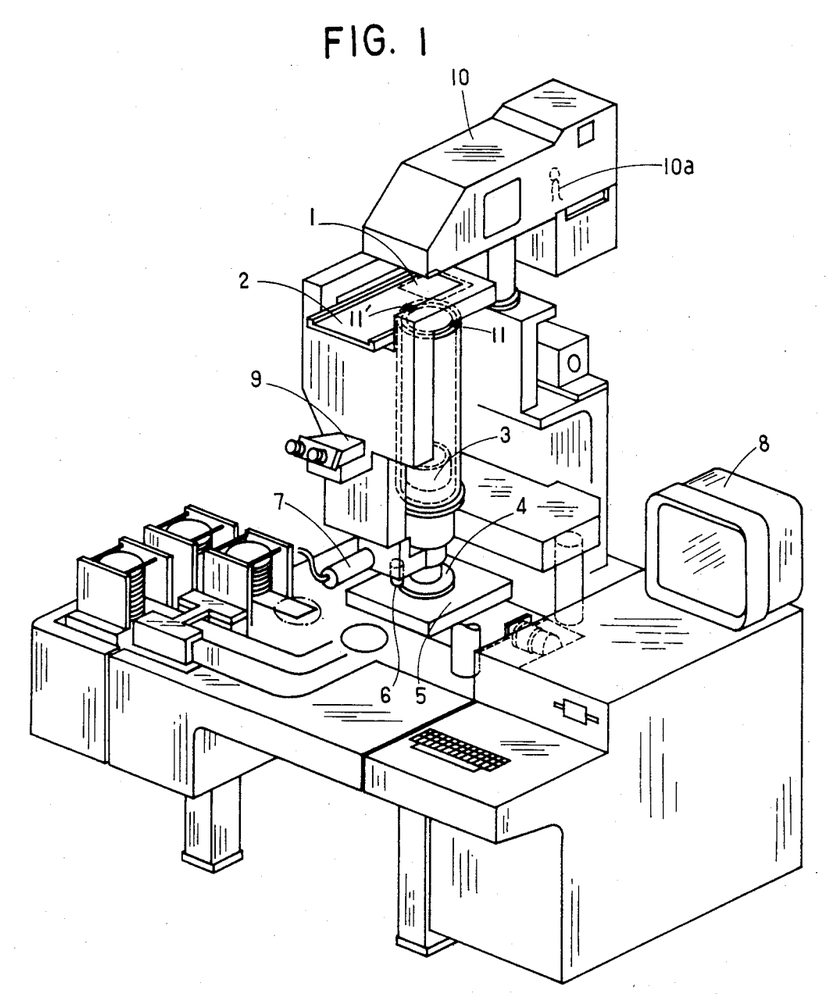
FIG. 1 is a perspective view of an aligner incorporating one embodiment of the present invention.

Referring to FIG. 1, the illustrated apparatus comprises a mask having the pattern of an integrated circuit thereon as well as mask alignment and mask-wafer alignment marks. The mask 1 is held by a mask stage 2 such that the mask can be translated and rotated in a plane. The apparatus further comprises a reduction-projecting lens 3 and a wafer stage 5 for holding a wafer 4 such that it can be translated and rotated in a plane. The wafer 4 has a photosensitive layer on which a mask-wafer alignment mark and wafer alignment mark are formed. The wafer stage 5 is also adapted to move between a wafer exposure position (in the field of projection) and a TV wafer alignment position. The apparatus further comprises an objective lens 6 for a TV wafer alignment detector, an image pickup tube or solid-stage image pickup element 7, a TV receiver 8 for observing images, a binocular unit 9 used to observe the surface of the wafer 4 through the projecting lens 3, an upper unit 10 containing an illumination optical system for converging light from a source of light 10a onto the mask to illuminate it and a mask-wafer alignment detector, and a signal processing circuit 12 for processing any error in alignment and driving the mask stage 2 such that the error will be eliminated.

The wafer stage 5 receives a wafer from a wafer transport means (not shown) and holds it at a predetermined position thereon. The wafer stage 5 is then moved to a position in which the alignment mark on the held wafer enters the field of view in the TV wafer alignment objective lens 6. This positional accuracy depends on the precision of the mechanical alignment. The field of view in the objective lens 6 is of a diameter in the order of one to two millimeters. If the alignment mark enters this field of view, it is detected by the image pickup tube 7 with the coordinative position thereof being sensed relative to a TV wafer alignment reference mark which is located in a TV wafer alignment optical system as will be described below. Since the position of the above TV wafer alignment reference mark and the auto-alignment detection position of the projection optical system are preset, the amount of feed in the wafer stage 5 into the auto-alignment position can be determined based on the above preset positions and the coordinative position of the TV wafer alignment mark.

The detective precision of the TV wafer alignment mark is ±5μ or less and in the order of ±10μ even in consideration of any error which may be produced when the wafer stage is being moved from the TV wafer alignment position to the mask-wafer alignment position. Therefore, the fine alignment may be made within the range of about ±10μ which is one-hundredth or less the field of view in the conventional alignment operation. As a result, the alignment can be made with higher speed. The TV wafer alignment will be described in detail.

Figure 2:
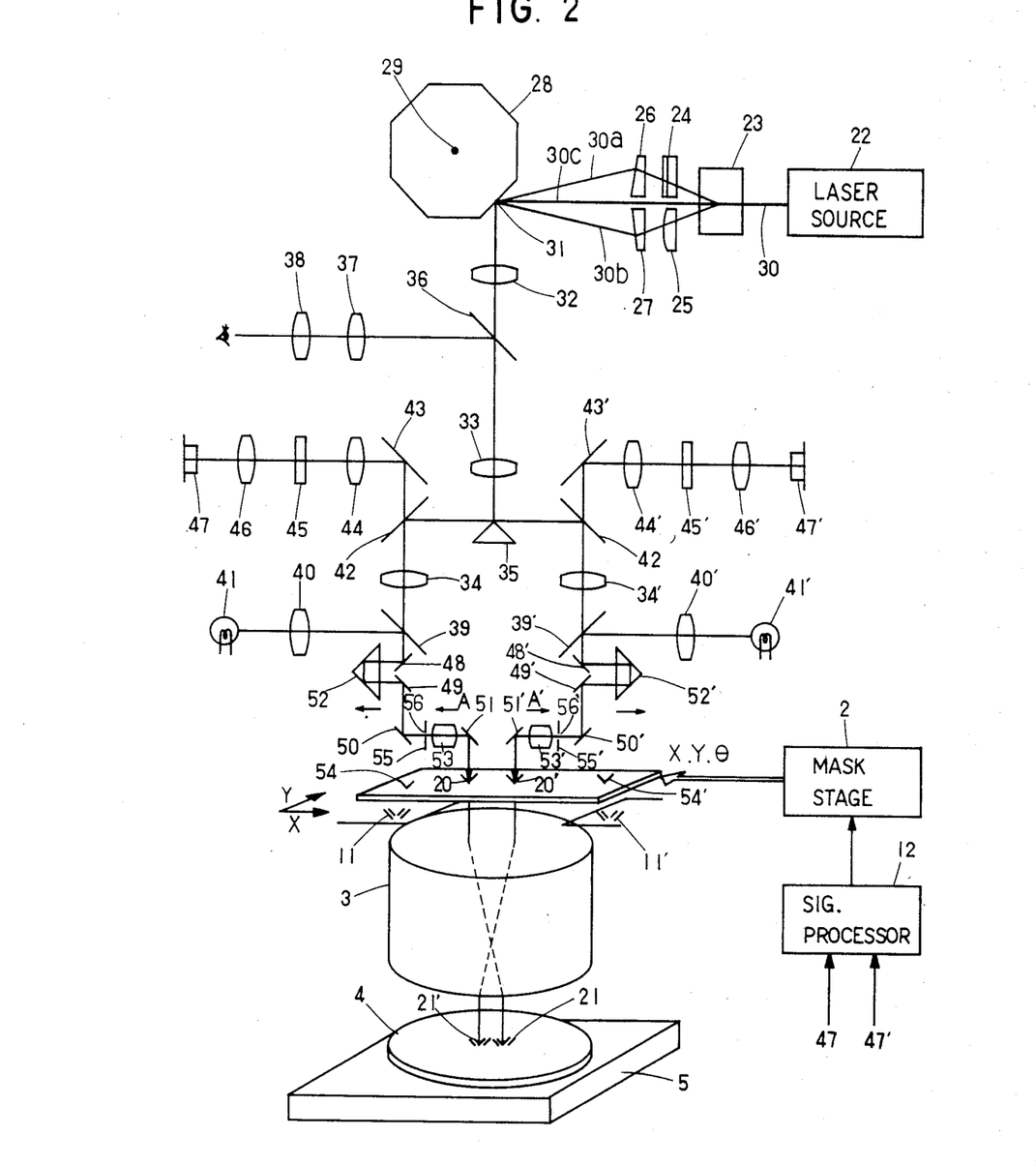
FIG. 2 is a side view of an optical system according to the present invention.

FIG. 2 shows one embodiment of the present invention in which the mask alignment and mask-wafer alignment can accomplished. This embodiment comprises the mask, reduction-projecting lens 3, wafer 4 and wafer stage 5 as in FIG. 1. However, the projecting lens 3 is diagrammatically depicted for convenience.

Figure 3A:
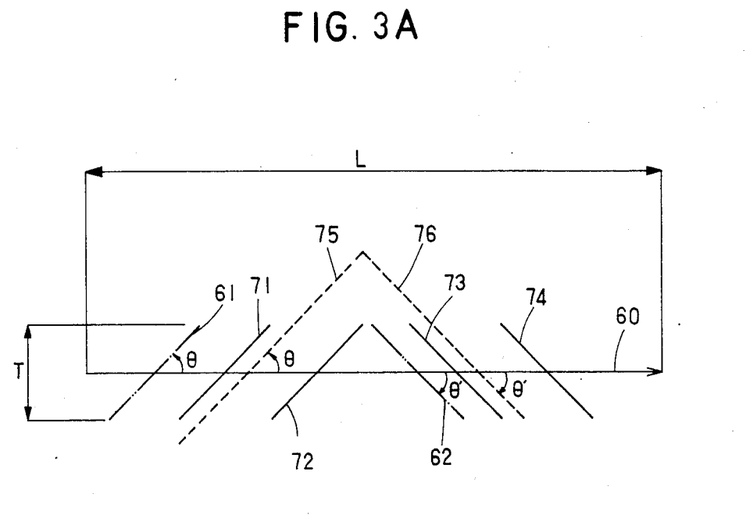
FIG. 3A is a plan view showing an alignment mark.

The mask 1 includes alignment marks in the form of straight lines or slits which are respectively formed thereon at positions 20 and 20' and which are inclined relative to a scanning line 60 by an angle of 45° as shown by 75, 76 in FIG. 3A. On the other hand, the wafer 4 includes alignment marks in the form of straight lines or slits which are respectively formed thereon at positions 21 and 21' and which are inclined relative to the scanning line 60 by an angle of 45° as shown by 71, 72, 73 and 74 in FIG. 3A. The mark 75 is associated with the marks 71 and 72 while the mark 76 is associated with the marks 73 and 74. Although a typical combination of marks has been shown in the drawings, the practical arrangement may be determined with respect to number, position and combination depending on the number of exposure shots, and for example, a shot number of marks are provided. Normally, the alignment is made based on signals from the right- and left-hand observation systems. As shown in FIGS. 1 and 2, there are provided mask alignment marks 11 and 11' formed on a stationary portion such as a lens barrel or part of the machine at positions near the mask 1. The marks 11 and 11' are identical in shape with the alignment marks 21 and 21' on the wafer 4. The mask 1 also includes mask alignment marks 54 and 54' which are identical in shape with the alignment marks as shown by 20 and 20'. However, the marks 11 and 11' may be identical in shape with the alignment marks 20 and 20' while the marks 54 and 54' may be identical in shape with the alignment marks 21 and 21'. In other words, it may be determined that the configuration produced when the mask alignment marks 11 and 54 are placed one above another is the same as that produced when the mask-wafer alignment marks 20 and 21 are placed one above another. The identity of shape herein intends to include that the marks are identical with each other in their basic configuration. The marks may be formed by lines having different widthwise dimensions or by broken lines without departing from the identity. The alignment marks on the mask 1 and wafer 4 are sized such that they will have no dimentional variation when projected or inversely projected through an optical system other than a one-to-one projection system. In the illustrated embodiment, it is such that a magnification of reduction is equal to the value obtained by dividing the size of the alignment mark on the wafer by the size of the alignment mark on the mask.

Returning now to FIG. 2, the apparatus comprises a source of laser beam 22 and a polarizer 23 which is in the form of an acoustooptic element or the like. The polarizer 23 can be changed in its light emitting orientation into three positions, upward, horizontal and downward positions by the use of external signals. The apparatus also comprises convergent cylindrical lenses 24 and 25 having the respective generating lines which intersect at right angles. These cylindrical lenses are adapted to convert the cross-sectional configuration of the laser beam into a linear shape. The apparatus further comprises trapezoid prisms 26 and 27 each of which reversely refracts the beam upwardly or downwardly deflected by the polarizer 23. A polygonal mirror 28 is rotated about a rotating shaft 29.

Depending on the state of the polarizer 23, the laser beam 30 from the source 22 forms a slit-like beam 30a passing through the cylindrical lens 24 and prism 26, a slit-like beam 30b passing through the cylindrical lens 25 and prism 27 or a spot-like beam 30c straight running without passing through any cylindrical lens and prism. In any event, the laser beam converges on a point 31 on the face of the polygonal mirror 28. The apparatus includes intermediate lenses 32, 33 and 34, an optical path dividing mirror 35, a half-mirror 36 for conducting the beam to a visual observation system (37 and 38), a field lens 37, an eye lens 38 for transmitting the image of the wafer to the human's eye, a half-mirror 39 for conducting the beam to an illumination system (40, 41) for illuminating the visual observation system, a condenser lens 40, an illumination lamp 41, a half-mirror 42 for conducting the beam to a photoelectric detection system (43, 44, 45 and 46), an optical path deflecting mirror 43, a lens 44, a spatial filter 45, a condenser lens 46, a photosensor 47, total reflection mirrors 48, 49, 50 and 51, a prism 52, a $f-\theta$ objective lens 53 and a mask alignment pattern 54 formed on the mask 1.

As seen from FIG. 2, the signal detection system consists of two symmetrical sections, the right-hand section having parts shown by numerals with primes and the left-hand section having parts shown by numerals without primes, as viewed by an operator toward the drawing.

The intermediate lenses 32, 33 and 34 form the oscillating image from the polygonal mirror 28 in a pupil 56 at the restricted position 55 of an objective lens 53. Thus, the laser beam will scan the mask and wafer as the polygonal mirror 28 is being rotated.

In the objective lens system, the objective lens 53, aperture 55, mirror 51 and prism 52 are movable in the directions X and Y by driving means (not shown) so that the observation and measurement positions of the mask 1 and wafer 4 can freely be changed. For example, the movement in the direction X is so made that as the mirror 51 is moved in the direction shown by an arrow A in FIG. 2, the objective lens 53 and aperture 55 are similarly moved in the direction A. Further, the prism also is moved in the direction A by one-half the movement of the mirror 51 to maintain the optical path length constant.

In the direction Y, the optical systems for observation and position detection are moved as a unit in the direction perpendicular to the plane of the drawing.

Figure 3B:
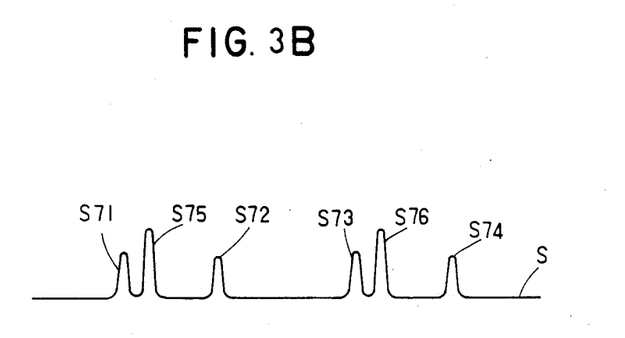
FIG. 3B is a view illustrating output signals produced when the alignment mark is scanned.

Referring to FIG. 3A, a linear scanning beam 61 on the optical path 30a passing through the cylindrical lens 24 is inclined relative to the scanning axis 60 by an angle of 45° and substantially parallel to the marks 71, 72 and 75. If a scan is made in such a condition, the photo-sensors 47 and 47′ generate signals S71, S75 and S72 as shown in FIG. 3B. These signals S71, S75 and S72 correspond to the alignment marks 71, 75 and 72, respectively. Even if there is any fine external matter on the scanned surface, it will not be detected in practice since the outputs of the sensors are averaged in a manner different from that in the spot-like beam.

On the other hand, a scanning beam 62 on the optical path 30b passing through the cylindrical lens 25 is inclined relative to the scanning axis 60 by an angle of −45° and parallel to the marks 73, 74 and 76. As a result, the sensors generate signals S73, S76 and S74 as shown in FIG. 3B. If the detection signals S71, S75, S72, S73, S76 and S74 are measured in space interval, any deviation between the mask and wafer can be determined. If the mask and wafer are properly aligned with each other, the spacings between the detection signals are equal to one another.

Automatic alignment systems proposed in U.S. Pat. Nos. 4,167,677 and 4,199,219 which have been assigned to the assignee of the present application, are incorporated into the specification for well understanding the invention.

In the embodiment shown in FIG. 2, the beam scanningly deflected by the rotating polygonal mirror is divided into the left- and right-hand detection systems on the way of the optical path. However, each of the detection systems may include a source of light and a scanner. In such a case, each of the detection systems may be moved as a whole in both the directions X and Y.

Although the mask-wafer alignment has been described as to the alignment of the alignment mark 20 on the mask 1 with the alignment mark 21 on the wafer 4, it is to be understood that, according to the present invention, by using the same optical systems and other alignment marks of the similar shapes, the mask alignment can also be made, in which the alignment mark 54 on the mask 1 is aligned with the mask reference mark 11 supported on the lens barrel 3 by any suitable means (not shown). In such a case, the objective lens 53, pupil 55, mirror 51 and prism 52 are moved to a position in which the alignment mark is to be aligned with the mask reference mark 11, in the direction as shown by A in FIG. 2.

Patterns in mask alignment include patterns for the mask reference mark 11 as shown by numerals 71, 72, 73 and 74 in FIG. 3A and patterns for the alignment mark 54 on the mask 1 as shown by numerals 75 and 76 in FIG. 3. In the mask alignment, therefore, the mask can be aligned with the mask reference mark to set the mask at a predetermined position relative to the lens 3 in the same manner as in the mask-wafer alignment.

In the mask alignment, the reduction-projecting lens 3 is not used. Accordingly, the alignment mark 54 on the mask and the mask reference mark 11 may be maintained at one-to-one magnification.

In a stepper type exposure apparatus, the reduction-projecting optical system is used so that the mask stage 2 (FIG. 1) holding the mask will normally be moved to execute the wafer alignment. Even in the mask alignment, the mask stage is moved to execute the alignment. Therefore, the two-line patterns 75 and 76 are provided on the mask which is a moving object in either case. However, this is an example of the invention, and four-line patterns 71, 72, 73 and 74 may be formed on the mask rather than the wafer. In addition, masks having patterns different in number from one another may be utilized in the mask alignment and wafer alignment. The selection of pattern is not restricted according to the present invention.

The mask alignment will now be described in more detail. In the mask alignment, a mask is conveyed and held from the mask change mechanism to the mask stage by any suitable means (not shown). At this time, the positioning is mechanically made to provide a reduced precision with an error of several hundreds $\mu$m.

If the field of view in the objective lens is decreased, the mask alignment mark is not necessarily positioned within the field of view, that is, the range in which the laser beam is moved to scan. That is, even if the objective lens is at a position in which the mask reference mark 11 is viewed through the objective lens, the alignment mark may be out of the field of view on the mask due to any error produced when the mask is set. In such a case, for example, only the signals S71, S72, S73 and S74 can be detected without detection of the remaining signals S75 and S76. Consequently, no auto-alignment can be realized.

In the above case, any suitable process for searching the marks on the mask is required. In the prior art, a stage holding the wafer or mask was moved to search the marks in a so-called repetitive groping, searching or sensing manner. This will be described in more detail with reference to FIG. 4A in connection with the prior art groping manner.

Figure 4A:
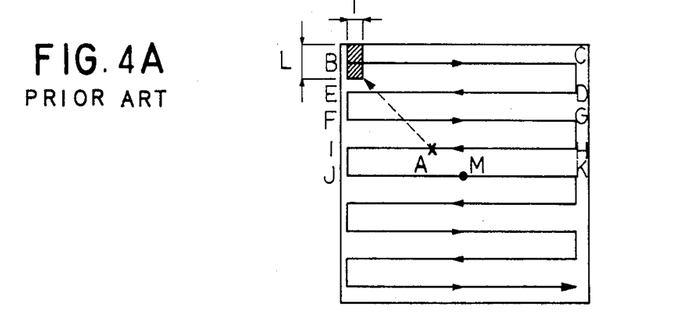
FIG. 4A is a plan view illustrating the operation in the prior art.

FIGS. 4A shows the locus of the objective lens as the alignment marks on the mask or wafer are being searched. Although the stage holding the mask or wafer is in fact moved in the directions X and Y rather than the objective lens, the description herein will be made to move the objective lens for convenience.

It is supposed that the mask has been conveyed to a position A (FIG. 4A) substantially below the objective lens 53 by a well known conveying means. This position A will be called "initial setting position". If there is any error produced upon setting the mask and when the length L and width T of the beam scanning range (FIG. 3A) are not sufficient to ignore the setting error, the mark M cannot be detected at the initial setting position A. Accordingly, the objective lens is moved to the margin of the groping range so that the groping motion will be started at a point B and continued from the point B through points C and D to a point E and so on to search the mark. In the illustrated arrangement, the mark M is detected during the movement from J to M in the third reciprocation.

It is noted that the prior art has the following disadvantages:

(1) Although the presence of the mark M is more possible near the position A, the objective lens is moved to the marginal region B in which the presence of the mark A is less possible, and then the search will be initiated at the region B. Thus, a long time is required to detect the mark.

(2) The stage is generally driven at a reduced speed with a higher accuracy. Therefore, when the alignment mark is to be searched, a long time is required to move the stage to a position in which the mark is to be detected.

Conversely, the present invention provides the following structure which can decrease time required to detect the mark:

(1) The search is made from the initial setting position of the objective lens to the marginal region.

(2) Further preferably, during the groping motion, the stage is not moved while the objective lens 53, the aperture 55 and the prism 52 defining an optical trombone are moved in the direction X and the entire scan optical system (22-55) are moved in the direction Y. In general, the stage is required to be set at the most precise position. Therefore, the mechanism for moving the stage should be of a structure compatible with such a precision, and thus, is not suitable for the drive of the stage at high speed.

Figure 4B:
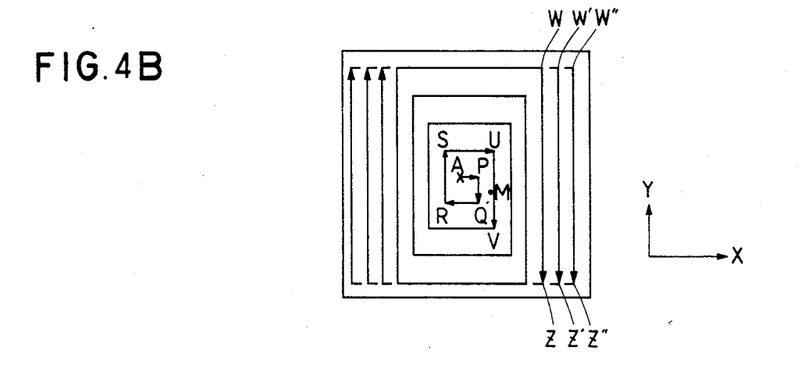
FIGS. 4B and 4C are plan views illustrating the operation in the embodiment of the present invention.

FIG. 4B shows the locus of the groping motion according to the present invention. The objective lens system is moved along a swirl pattern in the order represented by A, P, Q, R, S . . . while searching the mark. In the illustrated embodiment, the mark is detected on the portion of the swirl path between U and V. Since the presence of the mark M is more possible near the point A as described above, the time required to detect the mark can be reduced. It is assumed herein that the objective lens system is always set at the same position upon each initiation of the operation.

Figure 5:
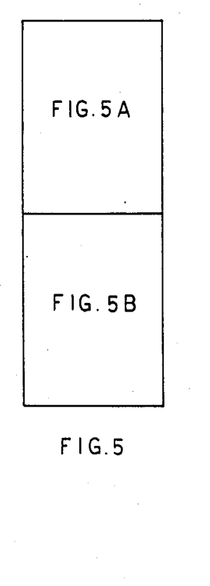
FIGS. 5A and 5B show a flow chart explaining a search operation in accordance with the present invention.
Figure 5A:
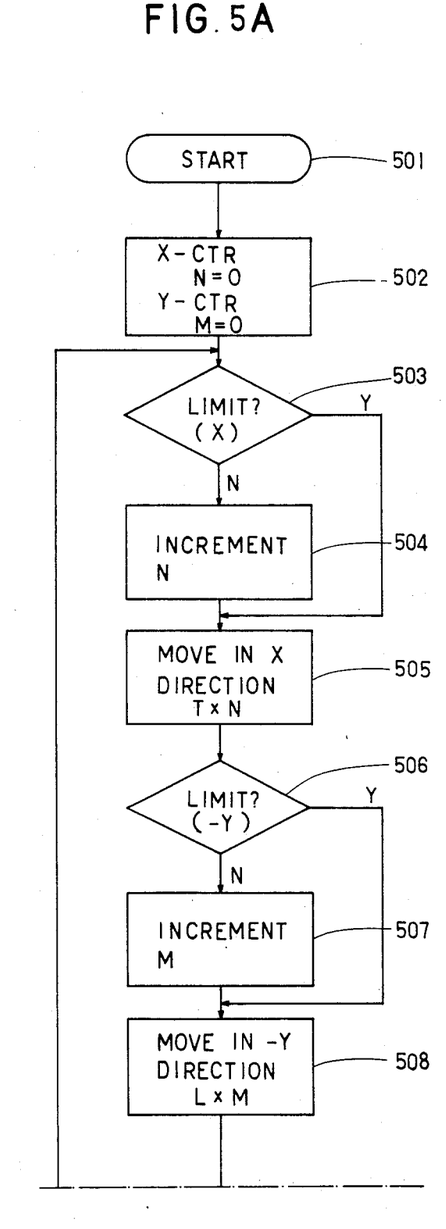
Figure 5B:
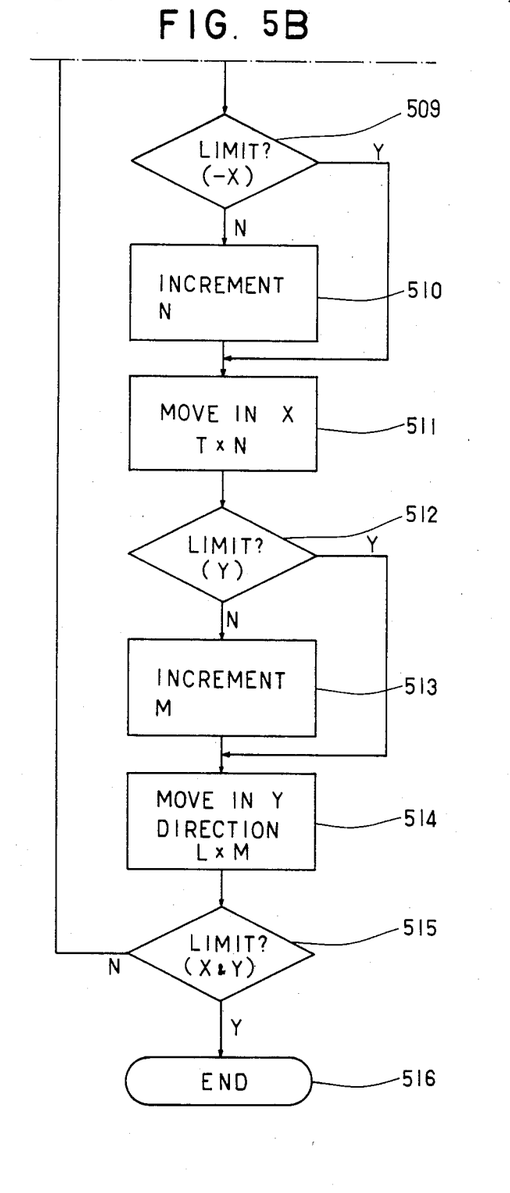

FIG. 5 consisting of FIGS. 5A and 5B shows a flow chart illustrating the movement of the objective lens system. The groping motion is started at Step 501. At Step 502, X- and Y-direction movement counters are first cleared. These counters serve to determine the movements of the objective lens in the direcitons X and Y shown in FIG. 4B. At step 503, it is then discriminated whether or not the objective lens reaches the margin (limit) in the direction X (limit check). If the objective lens does not reach the limit, the X-direction movement counter makes its content N to increment at Step 504.

If the objective lens reaches the limit after several passes in this loop as described below, the procedure clears Step 504 and proceeds from Step 503 directly to Step 505. At Step 505, the objective lens is moved forwardly in the direction X with the movement thereof being represented, for example, by T×N where T is the width of laser scan as seen from FIG. 3A. At the first loop, the objective lens is moved from A to P as shown in FIG. 4B.

If the objective lens has been moved by a predetermined amount in the direction X, the limit check is executed in the direction −Y at Step 506. If the objective lens does not reach the limit, the content M of the Y-direction movement counter is similarly incremented at Step 507. If the objective lens reaches the limit, the procedure clears Step 507 and proceeds directly to Step 508. At Step 508, the objective lens is moved in the direction −Y by an amount represented by L×M where L is the length of laser scan shown in FIG. 3.

Similar procedure is executed in the direction −X at Steps 509, 510 and 511. Subsequently, similar procedure is executed in the direction Y at Steps 512, 513 and 514. It is then checked whether or not the groping motion reaches the limit in all the directions X and Y at Step 515. If the groping motion reaches the limit, the procedure is terminated at Step 516. If the region to be searched still remains, the procedure returns to Step 503. The above mentioned loop is repeated until the groping motion reaches the limit.

Describing the movements in the directions X and Y by the use of symbols in FIG. 4B, $\overline{PQ}$ is twice $\overline{AP}$, $\overline{SU}$ is three times $\overline{AP}$ . . . and also $\overline{RS}$ is twice $\overline{PQ}$, $\overline{UV}$ is three times $\overline{PQ}$ and so forth. Therefore, the movement in the direction X or Y will be increased by $\overline{AP}$ or $\overline{RQ}$ at each motion. This amount of movement is counted by the X- or Y-direction movement counter. $\overline{AP}$ and $\overline{PQ}$ are equal to the width T and length L of laser scan, respectively.

If the groping motion reaches the limit in either of the opposite directions, for example, in the direciton −Y, the movement along the path represented by W′→Z′ is equal to that along the previous path represented by W→Z. This means that the procedure proceeds from Step 506 directly to Step 508 clearing Step 507 in the flow chart shown in FIG. 5.

In the mentioned procedure, the groping motion is necessarily made to detect two alignment patterns 75 and 76 on the mask. For example, if two patterns are to be detected after either of the patterns has been detected, the groping motion can be increased in pitch. In other words, $\overline{AP}$ and $\overline{PQ}$ may be larger than the values T and L, respectively. Thus, the amount of movement in the groping motion will not be limited to those of the above mentioned embodiments.

The present invention provides still another advantage with respect to the associated or independent motion of the right- and left-hand objective lens systems.

Although only one of the objective lens systems has been described with reference to FIGS. 3 and 4, both of them are used to search the alignment marks. There are selected, as desired, two modes, a first mode in which both the objective lens systems are moved, associated with each other and a second mode in which each of them is independently actuated.

In the first mode, for example, both the objective lens systems are moved to depict the locus shown in FIG. 4B. This first mode requires an average time which is slightly larger than that in the second mode as will be described. Since the objective lens systems are associated with each other in operation and control, however, the apparatus can be simplified in construction.

Figure 4C:
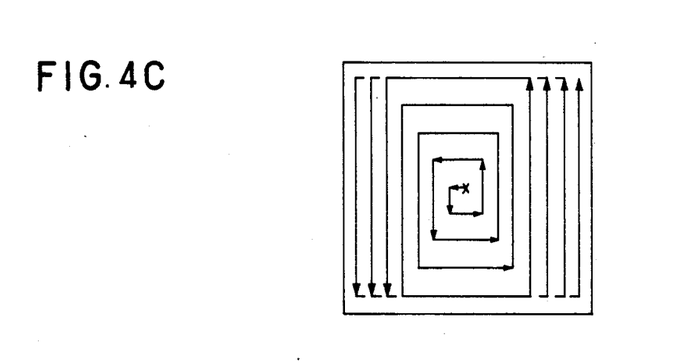

In the second mode, for example, one of the objective lens systems is moved clockwise in its groping motion as shown in FIG. 4B while the other objective lens system is moved counterclockwise in its groping motion as shown in FIG. 4C. This operation is slightly complicated in comparison with the first mode, but provides a reduced average time required to detect the alignment mark.

The present invention is characterized by the fact that the first, association mode or the second, independent mode can be selected as required. For example, the association mode may be selected near the initial setting position, and then the independent mode may be selected near the marginal region.

Another process may be adopted in which the association mode is continued until one of the alignment marks is detected and the independent mode is thereafter carried out to detect the total four patterns. This process is effective when the above groping motion is increased in pitch or when the mask has a deviation in the direction $\theta$.

The configuration of the scan beam will be described with respect to its selection and usage. As described with reference to FIG. 2, the laser beam 30 may be used as a laser beam straight passing the optical path 30c without passing through the cylindrical lenses 24 and 25. This laser beam is of a spot shape in cross-section and does not have any inclination as in the linear cross-section laser beam. Thus, signals can be obtained for all the patterns 71, 72, 73, 74, 75 and 76. This is particularly effective when the laser beam is sufficient in intensity and the mask alignment is made with a good ratio of S/N, but may be used in the mask-wafer alignment without limiting to the mask alignment. Alternatively, the mask alignment may be made by using the spot-shaped laser beam until four marks on the mask or the total six marks including four marks on the mask and two reference marks have been detected and then converting the spot-shaped laser beam into a linear cross-section laser beam on the way of the scanning operation. Thus, no complicated control is required and the alignment can be carried out more accurately by the use of the linear cross-section laser beam. Briefly, such a method is advantageous in that one of the linear and spot-shaped laser beams may be selected depending on an object to be scanned.

Alignment of the mask after the groping motion of the objective lens will be described with reference to FIG. 4B. As described above, the position M of the objective lens taken when the mask alignment mark on the mask has been detected in the groping motion can be determined simply based on the amount of movement from the reference mark position A. The objective lens system (52 and 53) is then returned from the position M to the position A and at the same time the mask stage 2 is moved from the position M to the position A. At this time, the mask reference mark and the mask alignment mark enter the field of view in the objective lens as shown in FIG. 3A. In such a situation, six alignment signals can be obtained. If the six alignment signals are determined in space interval, the alignment may be made.

TV wafer alignment detection device will be described with reference to FIG. 6.

Figure 6:
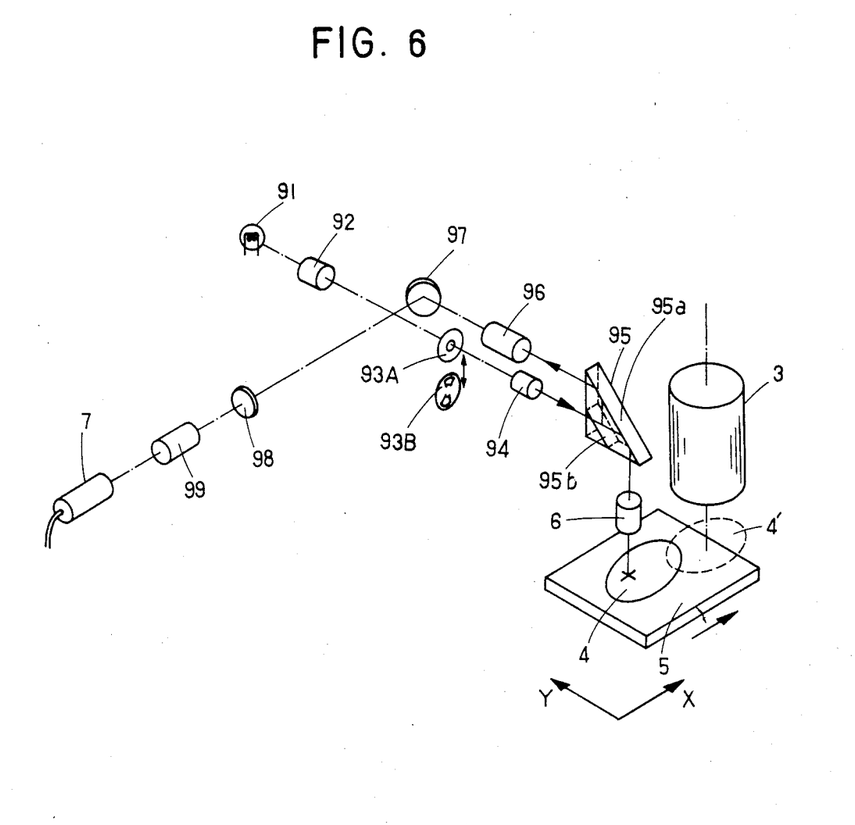
FIG. 6 is a perspective view of a wafer alignment system.

In FIG. 6, reduction-projecting lens 3, wafer 4, objective lens 6 and image pickup tube 7 are the same as those in FIG. 1. The illustrated apparatus comprises a source of illumination light 91 such as a halogen lamp, a condenser lens 92, and light- and dark-field apertures 93A and 93B one of which can be replaced by the other. FIG. 6 shows the light-field aperture 93A disposed within the optical path. The light source 91 is imaged on the light-field aperture 93A through the condenser lens 92. The apparatus also comprises an illumination relay lens 94 and a junction prism 95 which functions to cause the optical axes of the illumination and light receiving systems to coincide with each other and which includes an inner reflection surface 95a and a semi-transmission and reflection surface 95b. The light source 91, condenser lens 92, light- and dark-field apertures 93A and 93B, illumination relay lens 94, junction prism 95 and objective lens 6 define an illumination system which functions to cause the chief ray from the objective lens 6 to be incident on the wafer 6 in the vertical direction.

The apparatus further comprises a relay lens 96, a mirror 97 for deflecting the optical path, a sheet glass 98 including a wafer alignment reference mark formed thereon which functions to provide the origin in the coordinate so that the wafer alignment mark can be determined by an X-coordinate value and a Y-coordinate value, and an image pickup lens 99 which defines a light receiving system together with the junction prism 95, relay lens 96, mirror 97, sheet glass 98 and image pickup tube 7. After passed through the objective lens 6, the light is reflected by the inner reflection surface 95a of the junction prism 95 toward the semi-transmission surface 95b whereat the light is again reflected toward the inner reflection surface 95a. The light is then reflected by the inner reflection surface 95a toward the relay lens 96. After the wafer alignment mark on the wafer 4 has been imaged on the sheet glass 98 having the reference mark thereon, it is imaged on the image pickup face of the image pickup tube 7 together with the above reference mark.

The light beam from the light source 91 is converged by the condenser lens 12 to illuminate the light-field aperture 93A or the dark-field aperture 98B and then passes the illumination relay lens 94 to the junction prism 95. At the junction prism 95, the light beam passes the semi-transmission surface 95b thereof and is then reflected by the reflection surface 95a to the objective lens 6. After passed through the objective lens 6, the light beam illuminates the wafer 4.

The light beam reflected by the surface of the wafer 4 is incident on the junction prism 95 through the objective lens 6. At the junction prism 95, the light beam is reflected by the reflection surface 95a to the semi-transmission surface 95b whereat the light beam is reflected to the reflection surface 95a. After being reflected by the reflection surface 95a, the light beam exits the junction prism 95 and runs to the mirror 97 through the relay lens 96. At the mirror 97, the light beam is reflected to image on the sheet glass 98 and then imaged on the image pickup tube 7 through the image pickup lens 99. At this time, the image of the reference mark on the sheet glass 98 is picked up in the presence of the light-field aperture 93A as described above. Thus, the origin in the coordinates can be determined based on the above image. Subsequently, the dark-field aperture 93B is located in place of the light-field aperture 93A such that the wafer alignment mark can clearly be observed. Thus, the position of the wafer alignment mark image can be detected. Based on the position of the wafer alignment mark which has been electrically processed and determined, the wafer stage 5 is moved to such a position that the wafer 4 will be positioned in a predetermined location 4' within the projection field of the projection lens 3.

The wafer stage 5 may be moved into the projection field of the projection lens 3 after the wafer 4 has been once aligned with the standard position.

In accordance with the present invention, different alignments can be accomplished by the signal detection and processing under substantially the same program and by the use of optical systems having the same structure.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a photo-mask to a photosensitive member, comprising:
   a photo-mask including a first mark usable to align said photo-mask and a photosensitive member with each other and a second mark usable to align said photo-mask and said exposure apparatus with each other, said second mark having a pattern that is alignable with a pattern of said first mark;
   said photosensitve member including a third mark to be associated with said first mark;
   mark providing means, connected with said exposure apparatus, for providing a fourth mark to be associated with said second mark; and
   optical detection means, movable to be operatively associated with said first and second marks, both for detecting an error in alignment between said first and third marks and for detecting an error in alignment between said second and fourth marks.

2. An exposure apparatus as defined in claim 1 wherein said detection means includes a movable objective lens.

3. An exposure apparatus as defined in claim 1, further including a photo-mask stage for holding said photo-mask, said photo-mask stage being adapted to be driven in response to said detection means to eliminate the error in alignment between said second and fourth marks.

4. An exposure apparatus as defined in claim 1 wherein said detection means is movable in the direction perpendicular to said photo-mask.

5. An exposure apparatus as defined in claim 4 wherein said detection means is movable outwardly from its central preset position along a swirl pattern.

6. An exposure apparatus as defined in claim 4, wherein said detection means has plural detecting optical systems, and one of the detection systems is movable in association with the other system or independently therefrom.

7. An exposure apparatus as defined in claim 1 wherein said detection means includes projection means for selectively projecting a linear or spot-shaped illumination region to effect a linear scanning operation.

8. An exposure apparatus according to claim 1, wherein said first and second marks have substantially the same pattern.

9. An exposure apparatus as defined in claim 8 wherein said detection means includes a plurality of objective sections of each of which is movable relative to said photo-mask from a central preset position outwardly along a square swirling pattern and wherein said detection means is movable in a first direction while each of said objective sections is movable in the direction perpendicular to said first direction.

10. An exposure apparatus as defined in claim 9 wherein said objective sections are movable independently or in association with each other.

11. An apparatus for aligning two objects with each other, the first object having a first alignment pattern and the second object having a second alignment pattern, said apparatus comprising detection means for detecting an error in alignment between said first and second patterns, said detection means including means for selectively projecting a linear or spot-like illumination region onto said first and second objects in accordance with a required purpose of alignment and light receiving means for receiving light from said first and second patterns.

12. An apparatus as defined in claim 11 wherein said projecting means includes an anamorphic optic for forming said linear illumination region.

13. A method of alignment in an exposure apparatus having exposure means, comprising the steps of:
   providing a photo-mask;
   providing a photosensitive member;
   providing with the photo-mask a first mark usable to align the photo-mask and the photosensitive member with each other and a second mark usable align the photo-mask and the exposure apparatus with each other, said second mark having a pattern that is alignable with a pattern of the first mark, the photosensitive member including a third mark to be associated with the first mark of the photo-mask;
   providing with the exposure apparatus a fourth mark to be associated with the second mark;
   detecting an error in alignment between the second and fourth marks;
   causing relative movement between the apparatus and the photo-mask to bring the second and fourth marks into alignment;
   detecting an error in alignment between the first and third marks; and
   causing relative movement between the photo-mask and the photosensitive member to bring the first and third marks into alignment.

14. A method according to claim 13, said first and second marks having substantially the same pattern.

15. A method of setting a mask in a pattern exposure apparatus for exposing a wafer to a pattern of the mask, comprising:
   providing with said pattern exposure apparatus means for detecting a mark formed on the mask, said detecting means having a limited detecting field, means for moving the mask and a reference mark to be aligned with said mark of the mask;
   moving a part or all of said detecting means to search and detect said mark of the mask;
   moving the mask in accordance with a result of said searching and detecting step and also moving the part or all of said detecting means for said detecting means to catch both of said reference mark and said mark of the mask within said detecting field; and then
   aligning said mark of the mask with said reference mark.

16. An alignment apparatus, comprising:
   a plurality of movable means for detecting respective marks provided on a first member to be aligned with a second member;
   means for moving each of said movable detecting means relative to said first member;
   means for moving said movable detecting means in a first mode wherein said plural detecting means are moved interrelatedly with each other and in a second mode wherein said plural detecting means are moved independently from each other; and
   means for selecting said first mode or second mode.

* * * * *

UNITED STATES PATENT AND TRADEMARK OFFICE
CERTIFICATE OF CORRECTION

PATENT NO.   : 4,655,599

DATED        : April 7, 1987

INVENTOR(S)  : NAOKI AYATA, ET AL.

It is certified that error appears in the above-identified patent and that said Letters Patent is hereby corrected as shown below:

COLUMN 3

Line 2,   "-stage" should read -- -state--.

COLUMN 4

Line 20,  "dimentional" should read --dimensional--.
    Line 23,  "of" should read --or--.

COLUMN 6

Line 1,   "55," should read --56,--.
    Line 9,   "FIG. 3." should read --FIG. 3A.--.
    Line 64,  "well known" should read --well-known--.

COLUMN 7

Line 14,  "A" should read --M--.
    Line 32,  "be is set" should read --be set--.
    Line 53,  "direcitons" should read --directions--.

COLUMN 8

Line 19,  "above mentioned" should read --above-mentioned--.
    Line 25,  "RQ" should read --PQ--
    Line 30,  "direciton" should read --direction--.

COLUMN 10

Line 10,  "wafer 6," should read --wafer 4--.
    Line 32,  "lens 12" should read --lens 92--.
    Line 33,  "aperture 98B" should read --aperture 93B--.

UNITED STATES PATENT AND TRADEMARK OFFICE
CERTIFICATE OF CORRECTION

PATENT NO. : 4,655,599

DATED : April 7, 1987

INVENTOR(S) : NAOKI AYATA, ET AL.

It is certified that error appears in the above-identified patent and that said Letters Patent is hereby corrected as shown below:

<u>COLUMN 11</u>

Line 58, "sections of each" should read --sections each--.

<u>COLUMN 12</u>

Line 18, "usable align" should read --usable to align--.

Signed and Sealed this

Sixth Day of October, 1987

Attest:

DONALD J. QUIGG

Attesting Officer

Commissioner of Patents and Trademarks